United States Patent [19]
Winterrowd et al.

[11] Patent Number: 5,822,341
[45] Date of Patent: Oct. 13, 1998

[54] MULTIPORT RAM FOR USE WITHIN A VITERBI DECODER

[75] Inventors: Paul Winterrowd; Torkjell Berge, both of Moscow, Id.

[73] Assignee: Advanced Hardware Architectures, Inc., Pullman, Wash.

[21] Appl. No.: 418,661

[22] Filed: Apr. 6, 1995

[51] Int. Cl.$^6$ .................................................. G06F 11/10
[52] U.S. Cl. ........................................ 371/43.7; 371/43.1
[58] Field of Search ......................... 371/43, 43.1, 37.11,
371/12, 43.7; 395/432, 427, 976, 2.79;
365/230.03, 189.05, 185.04, 149; 375/262,
260, 341; 257/315

[56] References Cited

U.S. PATENT DOCUMENTS

| | | | |
|---|---|---|---|
| 4,302,775 | 11/1981 | Widergren et al. | 358/136 |
| 4,394,774 | 7/1983 | Widergren et al. | 382/56 |
| 4,539,684 | 9/1985 | Kloker | 371/46 |
| 4,748,626 | 5/1988 | Wong | 371/30 |
| 4,761,796 | 8/1988 | Dunn et al. | 375/1 |
| 4,937,781 | 6/1990 | Lee et al. | 395/476 |
| 5,014,235 | 5/1991 | Morton | 364/900 |
| 5,031,132 | 7/1991 | Dolazza | 364/724.12 |
| 5,101,446 | 3/1992 | Resnikoff et al. | 382/56 |
| 5,105,387 | 4/1992 | Childers et al. | 365/189.03 |
| 5,142,540 | 8/1992 | Glasser | 371/40.1 |
| 5,144,256 | 9/1992 | Lim | 329/302 |
| 5,175,702 | 12/1992 | Beraud et al. | 364/736 |
| 5,193,094 | 3/1993 | Viterbi | 371/43 |
| 5,204,841 | 4/1993 | Chappell et al. | 365/230.05 |
| 5,263,143 | 11/1993 | Robinson et al. | 395/427 |
| 5,271,061 | 12/1993 | Crandall | 380/28 |
| 5,327,375 | 7/1994 | Harahi | 365/149 |
| 5,342,990 | 8/1994 | Rossum | 84/603 |
| 5,365,551 | 11/1994 | Snodgrass et al. | 375/1 |
| 5,375,250 | 12/1994 | Van den Heuvel | 395/800 |
| 5,404,337 | 4/1995 | Sato | 365/230.03 |
| 5,408,129 | 4/1995 | Farmwald et al. | 257/692 |
| 5,432,804 | 7/1995 | Diamondstein et al. | 371/43 |
| 5,519,808 | 5/1996 | Benton, Jr. et al. | 395/2.79 |

FOREIGN PATENT DOCUMENTS

| | | |
|---|---|---|
| 0 404 013 A2 | 12/1990 | European Pat. Off. . |
| 0 593 404 A1 | 4/1994 | European Pat. Off. . |
| 63-275227 | 11/1988 | Japan . |
| 5091142 | 9/1993 | Japan . |

OTHER PUBLICATIONS

Sakurali et al., "Transparent–Refresh DRAM (TReD) Ssing Dual–Port DRAM Cell", IEEE, pp. 4.3.1–4.3.4, 1988.

Furuyama et al., "An Experimental 2–Bits/Cell Storage DRAM for Mcro Cell of Memory–on–Logic Application," IEEE, pp. 4.4.1–4.4.4, 1988.

George C. Clark and J. Bibb Cain, *Error–Correction Coding For Digital Communications*, Plenum Press, 1981, pp. 231–235.

E. Paaske, S. Pedersen and J. Sparso, An Area–Efficient Path Memory Structure for VLSI Implementation of High Speed Viterbi Decoders, Integration, The VLSI Journal, vol. 12, No. 1, Nov. 1991, pp. 79–91 (Netherlands).

*Primary Examiner*—Paul P. Gordon
*Assistant Examiner*—McDiennel Marc
*Attorney, Agent, or Firm*—Haverstock & Owens LLP

[57] ABSTRACT

A memory block structure for use within a viterbi decoder includes multiple dual port RAMs configured as multiport RAMs. The memory block structure is configured to allow a one-word write operation and an N-word read operation during a single clock cycle in order to achieve one decoded output symbol per clock period using the viterbi algorithm. By using dual port RAMs, a more densely packed and less expensive memory block structure is achieved. An encoded stream of input symbols are input to the viterbi decoder and written to the memory block structure one word at a time. Once X+Y bits have been written to the memory block structure, the decoder will then read N words from the memory block structure, simultaneously, reading back through X+Y words and outputting Y bits N at a time at the end of the trace back through memory. This process is repeated once the next Y words have been written to the memory block 22, with X+Y words being traced back through and the appropriate Y bits being output, until the entire encoded stream of input symbols has been decoded.

17 Claims, 4 Drawing Sheets

FIG. 4

MULTIPORT RAM FOR USE WITHIN A VITERBI DECODER

FIELD OF THE INVENTION

The present invention relates to the field of multiport random access memory cells. More particularly, the present invention relates to the field of multiport random access memory cells for use within viterbi or convolutional decoders.

BACKGROUND OF THE INVENTION

A convolutional or linear tree code is encoded by a device which accepts binary symbols in sets of m and outputs binary symbols in sets of n. Each set of n output symbols is determined by the current input set and a span of v of the preceding input symbols. A constraint length k of the code is equal to the span v. A measure of the code's efficiency or the code rate R is equal to the length m of the input sets divided by the length n of the output sets. A constraint length k convolutional encoder consists of a k-stage shift register with the outputs of selected stages being added modulo-2 to form the encoded symbols.

A linear code includes the property that two code words can be added to produce a third code word. This property vastly simplifies the encoding and decoding of a data stream by allowing a system to be designed to express any code word as the linear combination of a small set of reference code words known as basis vectors. This property also simplifies the problem of computing performance by making the distance between any two code words equivalent to the distance between the all-zero code word and some other code word. A Hamming distance value between a given code word and the all-zero code word is equivalent to the number of nonzero elements in the given code word.

The Viterbi algorithm is one method used to decode a stream of data encoded using a convolutional code encoder. Convolutional code decoders attempt to minimize the sequence error probability, rather than minimizing the actual number of symbol errors in the decoder output as compared to the encoder input. While such a procedure does not guarantee that the actual bit error rate will be minimized, making the sequence error rate small will also make the bit error rate small for all but extreme codes.

A decoder for decoding a convolutional code using the viterbi algorithm is implemented using a large memory for branch decision storage. A relatively small list of paths, or states, that will always contain the maximum likelihood choice is maintained. When decoding a convolutional code using the viterbi algorithm each possible state can only be preceded by two other states for a base code rate of one-half. Viterbi's algorithm is implemented by calculating the minimum error path leading to each of the possible states. Because each of the possible states is only preceded by two other states, the correct path is determined by comparing the sum of the previous two states and the incremental error along the appropriate path; the least of the two sums is chosen. These branch decisions are stored in the memory and eventually traced back through the memory. This traced back sequence of symbols results in the decoded signal.

In order to decode a stream of symbols, the decoder must trace back to some minimum depth of states until the path converges. Typically, a decoder will trace back to some depth X and then output the next Y bits. This produces a minimum traceback depth of X and a maximum traceback depth of X+Y. For implementation, a decoder must include a random access memory (RAM) having at least X+Y storage locations, which are filled with the stream of data. Once the X+Y storage locations are filled, the decoder will then traceback through the X+Y bits and output Y bits. Once the Y bits are output, the process is repeated with the next Y bits being written to the RAM, followed by the traceback and output of the next Y bits.

George C. Clark, Jr. and J. Bibb Cain in their text *Error Correction Coding for Digital Communications*, Plenum Press, New York, 1981, pp. 261–263, outline an approach whereby one decoded symbol per clock period can be achieved by tracing back at multiple words per clock cycle while concurrently writing. However, such a system requires a RAM which can handle a write and multiple reads during the same clock cycle. Such a multiport RAM cell is illustrated in FIG. 1.

Figure 1:
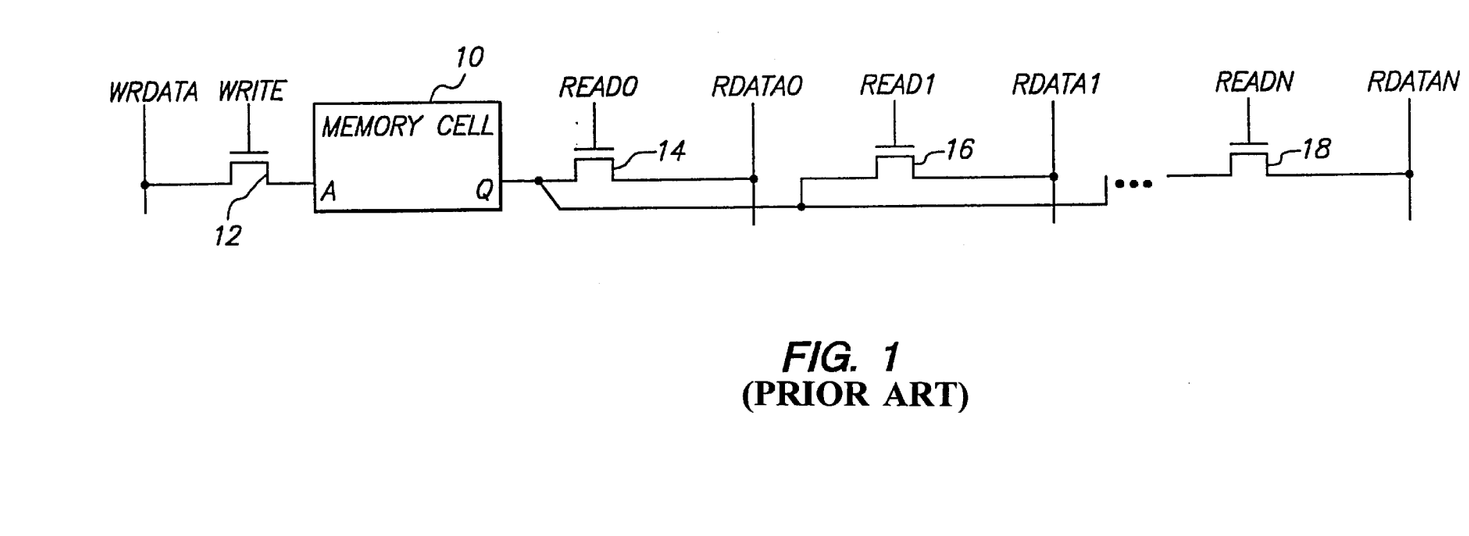
FIG. 1 illustrates a multiport RAM cell of the prior art, including a single write transistor and n read transistors.

The multiport RAM cell illustrated in FIG. 1 includes a memory cell 10 wherein a symbol is stored. The memory cell 10 includes a write port A, through which the symbol is written to the memory cell 10, and a read port Q, through which the symbol is read from the memory cell 10. A drain of a write transistor 12 is coupled to the write port A. A source of the write transistor 12 is coupled to a write data signal line wrdata. A gate of the write transistor 12 is coupled to a write signal line write for controlling when a symbol carried on the write data signal line wrdata is written to the memory cell 10. Data is written to the memory cell 10 by activating the write signal line write, which allows the voltage on the write data signal line wrdata to be stored in the memory cell 10 through the write port A.

A source of each read transistor 14, 16 and 18 is coupled to the read port Q of the memory cell 10 and to each other. A drain of the read transistor 14 is coupled to the read data signal line rdata0. A gate of the transistor 14 is coupled to the read signal line read0 for controlling when a symbol stored in the memory cell 10 is transferred to the read data signal line rdata0. A drain of the transistor 16 is coupled to the read data signal line rdata1. A gate of the transistor 16 is coupled to the read signal line read1 for controlling when a symbol stored in the memory cell 10 is transferred to the read data signal line rdata1. A drain of the transistor 18 is coupled to the read data signal line rdatan. A gate of the transistor 18 is coupled to the read signal line readn for controlling when a symbol stored in the memory cell 10 is transferred to the read data signal line rdatan. In this manner data can be read from the memory cell 10 and transferred to any of the read data signal lines rdata0–rdatan by activating any of the respective read signal lines read0–readn.

SUMMARY OF THE INVENTION

A memory block structure for use within a viterbi decoder includes multiple dual port RAMs configured as multiport RAMs. The memory block structure is configured to allow a one-word write operation and an N-word read operation during a single clock cycle in order to achieve one decoded output symbol per clock period using the viterbi algorithm. By using dual port RAMs, a more densely packed and less expensive memory block structure is achieved. An encoded stream of input symbols are input to the viterbi decoder and written to the memory block structure one word at a time. Once X+Y bits have been written to the memory block structure, the decoder will then read N words from the memory block structure, simultaneously, and output an appropriate Y bits. This process is repeated with the next word being written to the memory block 22 and the corresponding X+Y bits being traced back and the appropriate Y bits being output, until the entire encoded stream of input symbols has been decoded.

DETAILED DESCRIPTION OF THE PREFERRED EMBODIMENT

Figure 2:
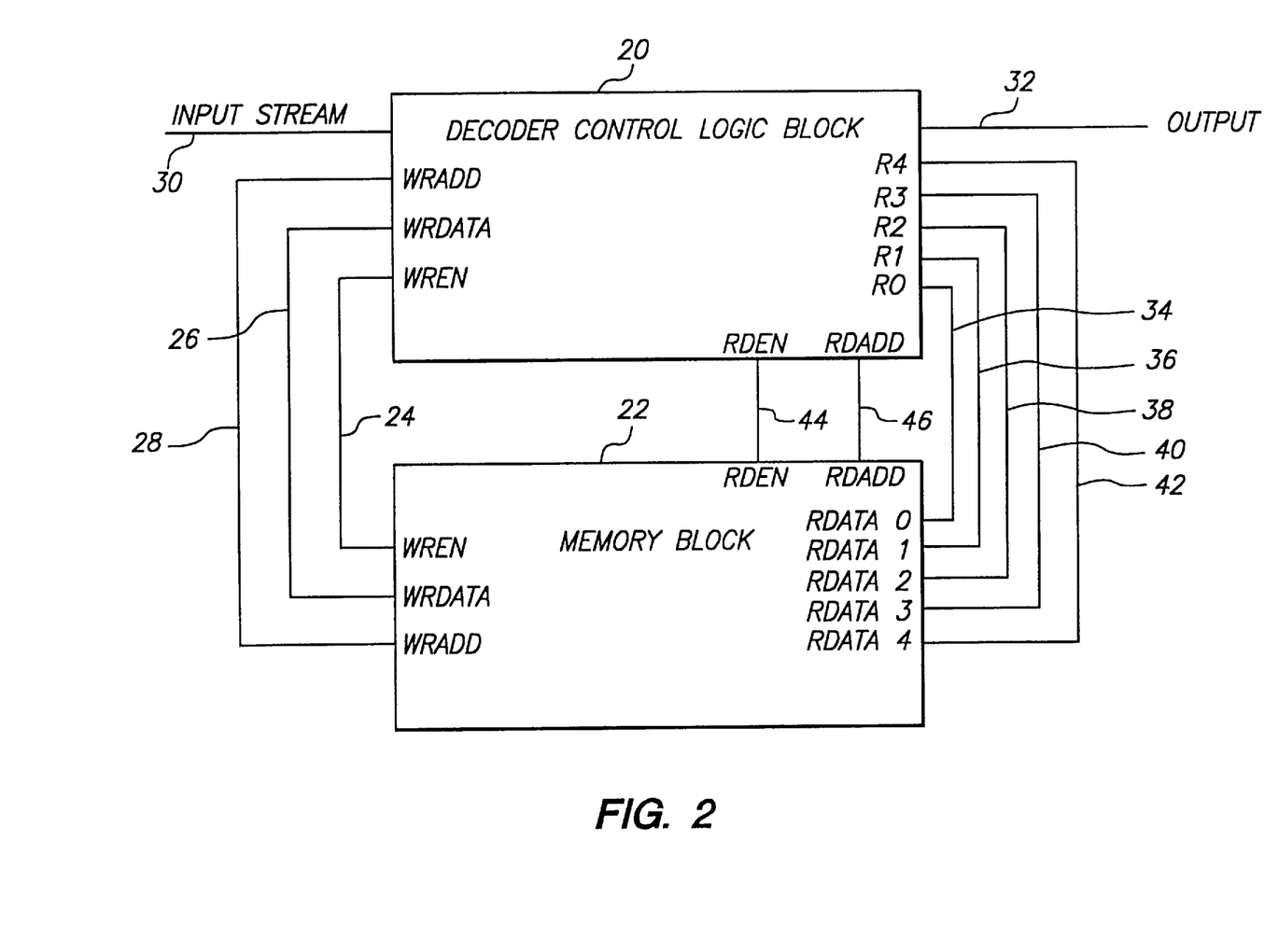
FIG. 2 illustrates a viterbi decoder according to the present invention.

A viterbi decoder according to the present invention is illustrated in FIG. 2. The viterbi decoder according to the present invention includes a decoder control logic block 20 and a memory block 22. The input stream of symbols to be decoded is input to the decoder control logic block 20 on the input data signal line 30. The decoded output stream of symbols is output on the output data signal line 32. In order to implement the viterbi algorithm and achieve one decoded symbol per clock cycle, one word of data is written to the memory block 22 per clock cycle and multiple words are read from the memory block 22 per clock cycle. The data read from the memory block 22 is then used by the decoder control logic block to determine the next symbol or word to be output on the output data signal line 32.

The decoder control logic block 20 controls the operation of the memory block 22. The next word to be written to the memory block 22 is transmitted on the write data signal line wrdata 26. The write data signal line wrdata 26 is activated by the decoder control logic block and is coupled between the decoder control logic block 20 and the memory block 22. The address within the memory block 22 where the next word is to be written is transmitted on the write address signal line wradd 28. The write address signal line wradd 28 is activated by the decoder control logic block and is coupled between the decoder control logic block 20 and the memory block 22. A write operation to the memory block 22 is enabled by the write enable signal line wren 24. The write enable signal line wren 24 is also activated by the decoder control logic block 20 and is coupled between the decoder control logic block 20 and the memory block 22. The memory block 22 of the present invention includes the ability to read N words per clock cycle. In the preferred embodiment of the present invention, the memory block 22 includes the ability to read five words per clock cycle.

The first word read from the memory block 22 is transmitted on the read data signal line rdata0 34. The read data signal line rdata0 34 is activated by the memory block 22 and is coupled between the memory block 22 and the decoder control logic block 20. The second word read from the memory block 22 is transmitted on the read data signal line rdata1 36. The read data signal line rdata1 36 is activated by the memory block 22 and is coupled between the memory block 22 and the decoder control logic block 20. The third word read from the memory block 22 is transmitted on the read data signal line rdata2 38. The read data signal line rdata2 38 is activated by the memory block 22 and is coupled between the memory block 22 and the decoder control logic block 20. The fourth word read from the memory block 22 is transmitted on the read data signal line rdata3 40. The read data signal line rdata3 40 is activated by the memory block 22 and is coupled between the memory block 22 and the decoder control logic block 20. The fifth word read from the memory block 22 is transmitted on the read data signal line rdata4 42. The read data signal line rdata4 42 is activated by the memory block 22 and is also coupled between the memory block 22 and the decoder control logic block 20. The address within the memory block 22 where the data is to be read from is transmitted on the read address signal line rdadd 46. The read address signal line rdadd 46 is activated by the decoder control logic block 20 and is coupled between the decoder control logic block 20 and the memory block 22. A read operation from the memory block 22 is enabled by the read enable signal line rden 44. The read enable signal line rden 44 is activated by the decoder control logic block 20 and is also coupled between the decoder control logic block 20 and the memory block 22.

A multiport RAM structure including multiple multiport RAM cells, as illustrated in FIG. 1, to which one symbol could be written and multiple symbols could be read from within the same clock cycle, was discussed above. While the implementation of a viterbi decoder including such a multiport RAM structure will achieve one decoded symbol per clock period, such a multiport RAM structure is disadvantageous because it does not achieve a dense RAM core and is relatively expensive. A multiport RAM cell, as illustrated in FIG. 1, requires one write transistor, n read transistors and the number of transistors required to implement the memory cell 10. The memory cell 10 is typically implemented by four transistors. Therefore, a typical multiport RAM cell, as illustrated in FIG. 1, will require 5+n transistors. Because of the numerous transistors required for each multiport RAM cell, this design does not achieve a dense RAM core, takes up a lot of silicon area and is expensive to implement.

Figure 3:
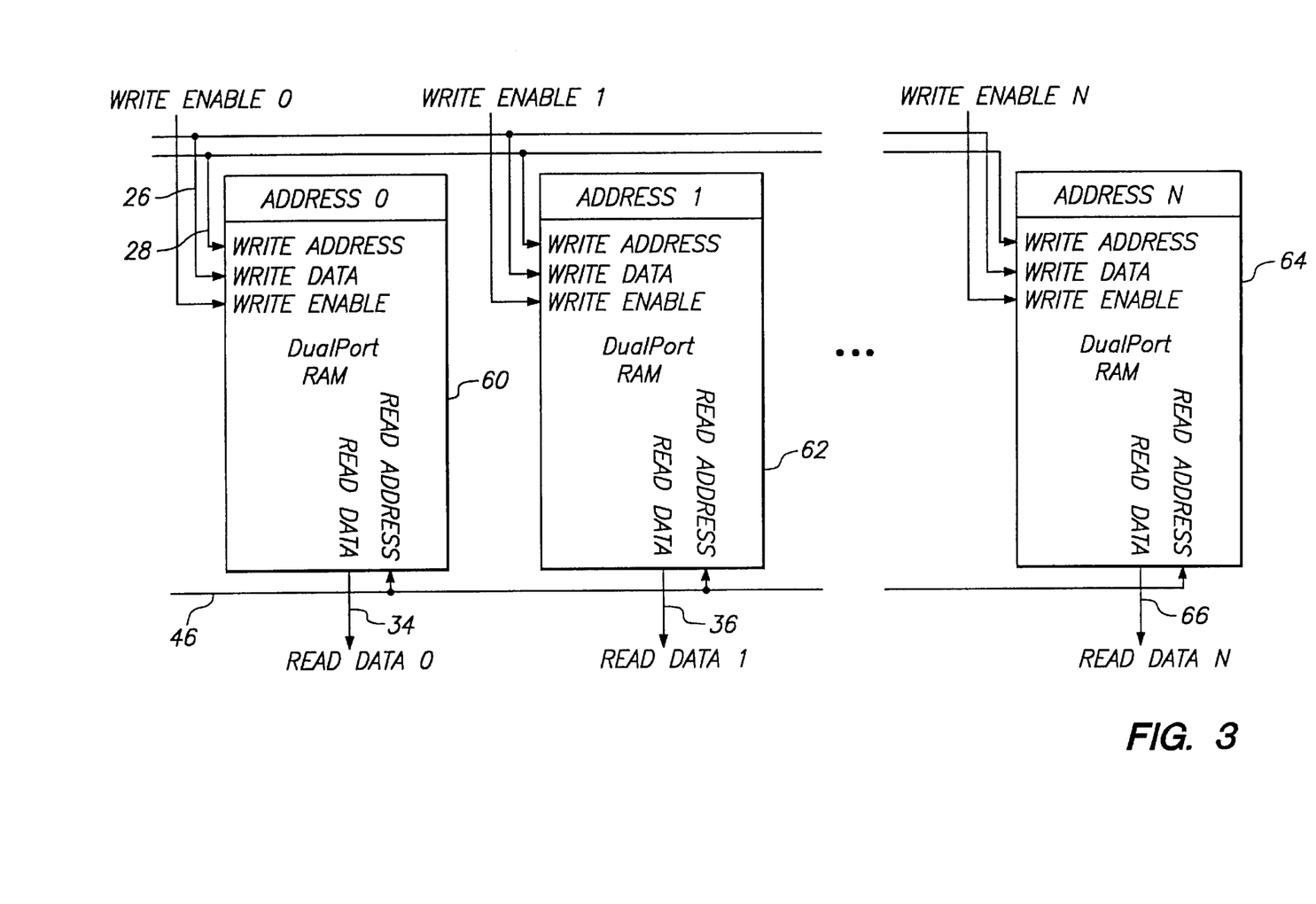
FIG. 3 illustrates a schematic block diagram of the memory block of the present invention including N dual port RAMs.

A schematic block diagram of the memory block 22 of the present invention is illustrated in FIG. 3. A number N of dual port RAMs 60, 62 and 64 are included within the memory block structure 22. The dual port RAMs 60, 62 and 64 are configured as multiple RAM cores wherein one word can be written and N words can be read during a single clock cycle. In this manner a more densely packed RAM core is achieved than a memory block implemented with multiport RAM cells, as illustrated in FIG. 1. The memory block 22 having dual port RAM cells configured as multiport RAM cells is also less expensive to implement than a memory block including multiport RAM cells.

The write address signal bus 28 is coupled to each of the dual port RAMs 60, 62 and 64. The write data signal bus 26 is also coupled to each of the dual port RAMs 60, 62 and 64. A respective write enable signal line is coupled to each of the dual port RAMs 60, 62 and 64 for enabling a write operation to the appropriate RAM 60, 62 or 64. A read address signal bus 46 is coupled to each of the dual port RAMs 60, 62 and 64. Read data signal lines 34, 36 and 66 are coupled to each of the dual port RAMs 60, 62 and 64, respectively.

Figure 4:
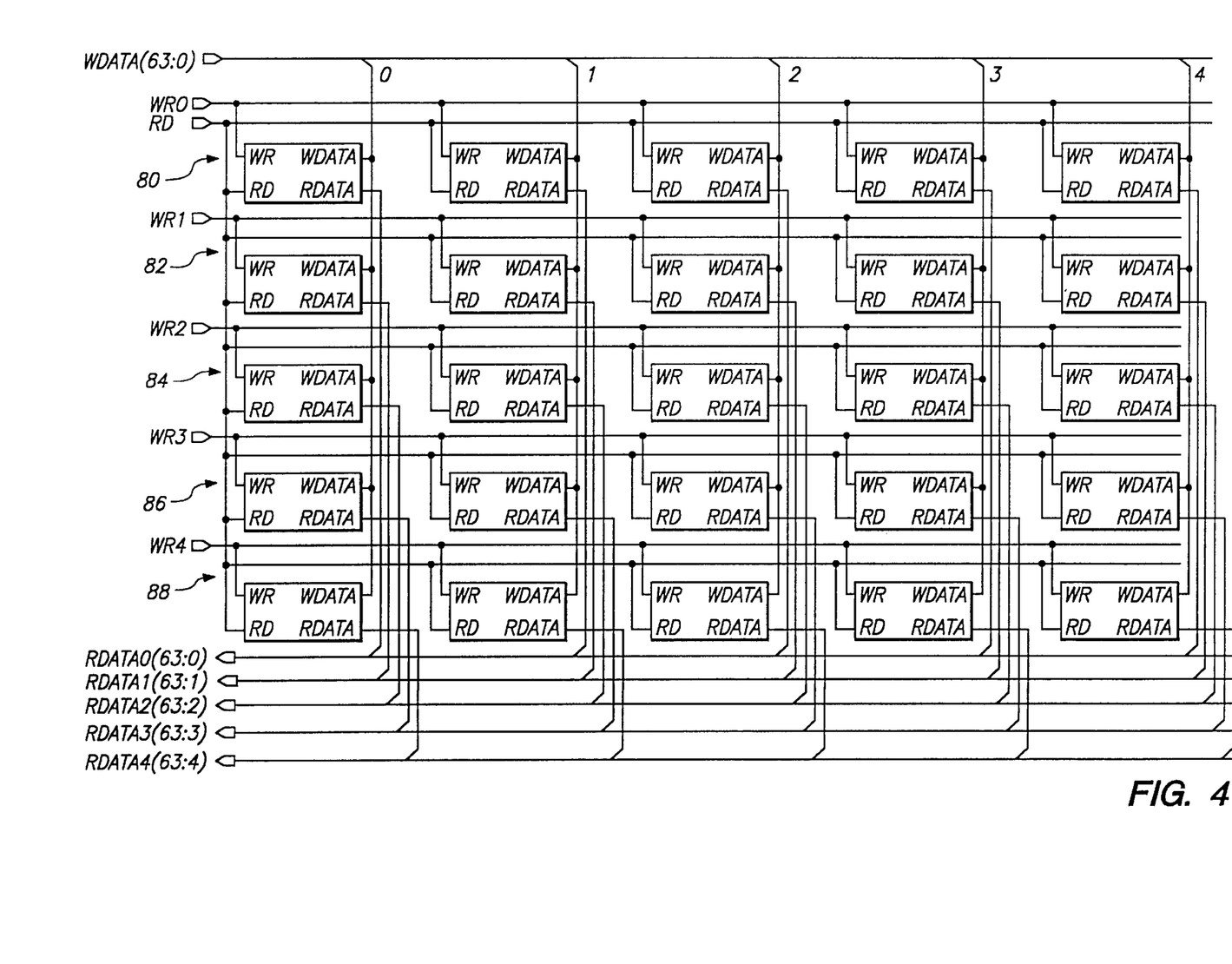
FIG. 4 illustrates a detailed schematic block diagram of a page of the dual port RAM structure of the present invention.

The preferred embodiment of the present invention writes one word of data to the memory block 22 and reads five words of data from the memory block 22 in a single clock cycle. In this preferred embodiment a word of data includes 64 bits. A portion of a dual port RAM structure of the preferred embodiment is illustrated in FIG. 4. The RAM structure illustrated in FIG. 4 includes the memory cells for the first five bits of a word within the dual port RAM structure. The RAM structure for the remaining 59 bits is identical to the structure illustrated in FIG. 4.

The RAM structure of the present invention illustrated in FIG. 4 includes five words, each encompassing a row of bits, wherein each of the corresponding bits within the words are arranged in corresponding columns. The write data signal bus wrdata includes bits 0 through 63, each bit coupled to each corresponding memory cell within its column. A write enable signal line wr0 is coupled to each of the memory cells within the first word 80, for enabling a write operation of a word on the write data signal bus to the memory cells of the first word 80, bits 0–63. A write enable signal line wr1 is coupled to each of the memory cells within the second word 82 for enabling a write operation of a word on the write data signal bus to the memory cells of the second word 82, bits 0–63. A write enable signal line wr2 is coupled to each of the memory cells within the third word 84 for enabling a write operation of a word on the write data signal bus to the memory cells of the third word 84, bits 0–63. A write enable signal line wr3 is coupled to each of the memory cells within the fourth word 86 for enabling a write operation of a word on the write data signal bus to the memory cells of the fourth word 86, bits 0–63. A write enable signal line wr4 is coupled to each of the memory cells within the fifth word 88 for enabling a write operation of a word on the write data signal bus to the memory cells of the fifth word 88, bits 0–63. During a write operation, a word transmitted on the write data signal bus wrdata will be written to an appropriate one of the words 80, 82, 84, 86 or 88, depending on which of the write enable signal lines wr0–wr4 is activated.

A read data signal bus rdata0 is coupled to the bits 0–63 of the first word 80. A read data signal bus rdata1 is coupled to the bits 0–63 of the second word 82. A read data signal bus rdata2 is coupled to the bits 0–63 of the third word 84. A read data signal bus rdata3 is coupled to the bits 0–63 of the fourth word 86. A read data signal bus rdata4 is coupled to the bits 0–63 of the fifth word 88. A read enable signal line rd is coupled to each of the cells, 0–63, within each of the first through fifth words 80, 82, 84, 86 and 88. In this manner, when the read enable signal line rd is activated during a read operation, the first word through the fifth word are all transmitted on their respective read data signal busses rdata0–rdata4, during a single clock cycle. The memory block 22 of the present invention will therefore write one 64 bit word and read five 64 bit words per clock cycle, thereby allowing the viterbi decoder to achieve one decoded symbol per clock period, without the required space and expense associated with a multiport RAM structure.

In the viterbi decoder of the present invention an encoded stream of symbols are input to the decoder control logic block 20 on the input data signal line 30. The symbols input on the input data signal line 30 are written to the memory block 22, as 64 bit words, one word at a time. Once X+Y words have been written to the memory block 22, the decoder will then read five 64 bit words, simultaneously, each clock cycle, tracing back through X+Y words and outputting a bit for each of the last Y words five at a time. This process is repeated with the next Y words five at a time. This process is repeated with the next Y words being written to the memory block 22 and the corresponding X+Y words being traced back and the appropriate Y bits being output on the output data signal line 32, until the entire encoded stream of symbols has been decoded and output on the output data signal line 32.

It should be apparent to those skilled in the art that a memory block 22 achieving reads of more or less than five words may be implemented in the manner taught by the present invention by coupling an appropriate number of memory cells together to implement the appropriate number of words. Correspondingly, words of different lengths may also be implemented using the structure taught by the present invention. Decoders for decoding different types of convolutional codes may therefore be implemented by varying the number and configuration of the memory cells within the memory structure taught by the present invention.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A viterbi decoder for decoding an input stream of encoded symbols and outputting appropriate decoded symbols comprising:

a. means for receiving encoded data from an input source;

b. control means coupled to the means for receiving for controlling operation of the viterbi decoder for receiving a plurality of stored data on which to perform a trace back operation outputting one decoded symbol per clock cycle; and c. a dual port memory structure having a plurality of dual port RAMs, wherein the memory structure is coupled to the means for receiving and to the control means for storing one word of encoded data received from the input source and transmitting the plurality of stored data to the control means during a single clock cycle, further wherein the dual port RAMs are coupled to receive a same read enable signal.

2. The viterbi decoder as claimed in claim 1 wherein the dual port memory structure is divided into a plurality of data words each including a plurality of dual port memory cells.

3. The viterbi decoder as claimed in claim 2 further comprising a write enable signal line coupled between the control means and the dual port memory structure for controlling and activating a write operation to an appropriate one of the plurality of data words.

4. The viterbi decoder as claimed in claim 3 further comprising a write address signal bus coupled between the control means and the dual port memory structure for specifying to which of the plurality of data words data is to be written.

5. The viterbi decoder as claimed in claim 4 further comprising a write data signal bus coupled between the control means and the dual port memory structure for transmitting current data to be stored from the control means to the appropriate one of the plurality of data words.

6. The viterbi decoder as claimed in claim 5 further comprising a plurality of read data signal busses coupled between the control means and the dual port memory structure for transmitting a plurality of stored words to the control means.

7. The viterbi decoder as claimed in claim 6 wherein a word includes 64 bits.

8. The viterbi decoder as claimed in claim 7 wherein the viterbi decoder includes five read data signal busses each for simultaneously transmitting a word from the dual port memory structure to the control means.

9. A viterbi decoder for decoding an input stream of encoded symbols and outputting appropriate decoded symbols comprising:

a. means for receiving encoded data from an input source;

b. a dual port memory structure including a first plurality of dual port memory cells coupled together to form a plurality of data words, each of the data words including a second plurality of dual port memory cells, wherein the dual port memory structure will support a write operation to one word and a read operation of more than one of the plurality of data words per clock cycle, further wherein the first plurality of dual port memory cells are coupled to receive a same read enable signal; and c. control means coupled to the means for receiving and to the dual port memory structure for controlling write and read operations of the dual port memory structure and further receiving more than one of the plurality of data words on which to perform a trace back operation outputting a decoded symbol per clock cycle.

10. The viterbi decoder as claimed in claim 9 wherein the dual port memory structure is configured to output five words during a single clock cycle.

11. The viterbi decoder as claimed in claim 10 wherein a word includes 64 bits.

12. The viterbi decoder according to claim 11 wherein the controller further comprises a write enable output coupled to the plurality of dual-port RAMs for selectively enabling a write operation of one of the plurality of dual-port RAMs.

13. The viterbi decoder according to claim 12 wherein the dual-port RAMs are coupled together to receive a same read enable signal.

14. The viterbi decoder according to claim 13 wherein the dual-port RAMs are coupled together to receive the same write address.

15. The viterbi decoder according to claim 14 wherein the dual-port RAMs are coupled together to receive the same read address.

16. The viterbi decoder according to claim 15 wherein the data word includes 64 bits.

17. A viterbi decoder comprising:
   a. a controller circuit coupled to receive a stream of encoded symbols;
   b. a memory circuit coupled to the controller circuit for receiving the stream of encoded symbols from the controller circuit in response to a clock signal and for providing in parallel a plurality of previously received encoded symbols; and
   c. a trace back circuit in the controller circuit coupled for receiving and decoding the plurality of previously received encoded symbols in a single clock cycle.

* * * * *

UNITED STATES PATENT AND TRADEMARK OFFICE
CERTIFICATE OF CORRECTION

PATENT NO. : 5,822,341

DATED : October 13, 1998

INVENTOR(S) : Winterrowd et al.

It is certified that error appears in the above-identified patent and that said Letters Patent is hereby correct as shown below:

IN THE ABSTRACT

In the title page, delete "17 Claims" and insert --18 Claims--.

IN THE CLAIMS

In Column 7, line 20, insert immediately before "12. The viterbi", the following claim:

--12. A viterbi decoder for decoding an input stream of encoded symbols, the decoder comprising:

a. a controller having a first input for receiving the input stream of encoded symbols, a first output for outputting at least one decoded symbol per clock cycle, a second output for outputting a data word to be stored, a plurality of second inputs for receiving a plurality of stored data words on which to perform a trace back operation, a third output for providing a write address, and a fourth output for providing a read address; and b. a multiport memory controlled by the controller, the multiport memory including a plurality of dual-port RAMs, wherein each of the dual-port RAMs is coupled to the second output for receiving the data word to be stored, to the plurality of second inputs for providing the plurality of stored data words, to the third output for receiving the write address, and to the fourth output for receiving the read address.--.

UNITED STATES PATENT AND TRADEMARK OFFICE
CERTIFICATE OF CORRECTION

PATENT NO. : 5,822,341

DATED : October 13, 1998

INVENTOR(S) : Winterrowd et al.

It is certified that error appears in the above-identified patent and that said Letters Patent is hereby correct as shown below:

IN THE CLAIMS

In Column 7, line 20, delete "12" and insert --13--.

In Column 7, line 20, delete "11" and insert --12--.

In Column 8, line 1, delete "13" and insert --14--.

In Column 8, line 1, delete "12" and insert --13--.

In Column 8, line 4, delete "14" and insert --15--.

In Column 8, line 4, delete "13" and insert --14--.

In Column 8, line 7, delete "15" and insert --16--.

In Column 8, line 7, delete "14" and insert --15--.

UNITED STATES PATENT AND TRADEMARK OFFICE
CERTIFICATE OF CORRECTION

PATENT NO. : 5,822,341
DATED : October 13, 1998
INVENTOR(S) : Paul Winterrowd, et al.

It is certified that error appears in the above-identified patent and that said Letters Patent is hereby corrected as shown below:

In Column 8, line 10, delete "16" and insert --17--.

In Column 8, line 10, delete "15" and insert --16--.

In Column 8, line 12, delete "17" and insert --18--.

Signed and Sealed this

Twentieth Day of April, 1999

Attest:

Q. TODD DICKINSON

*Attesting Officer*     *Acting Commissioner of Patents and Trademarks*